US012658955B2

(12) United States Patent
Kim et al.

(10) Patent No.: US 12,658,955 B2
(45) Date of Patent: Jun. 16, 2026

(54) PROMOTING COEXISTENCE OF MULTIPLE RADIO SYSTEMS THROUGH THE MITIGATION OF DESENSITIZATION AND INTERMODULATION EFFECTS

(71) Applicant: NETGEAR, Inc., San Jose, CA (US)

(72) Inventors: Taeho Kim, Richmond (CA); Joseph Amalan Arul Emmanuel, San Jose, CA (US)

(73) Assignee: NETGEAR, INC., San Jose, CA (US)

( * ) Notice: Subject to any disclaimer, the term of this patent is extended or adjusted under 35 U.S.C. 154(b) by 618 days.

(21) Appl. No.: 17/930,351

(22) Filed: Sep. 7, 2022

(65) Prior Publication Data

US 2024/0080056 A1 Mar. 7, 2024

(51) Int. Cl.
H04B 1/40 (2015.01)
H03H 7/01 (2006.01)
H04B 1/10 (2006.01)

(52) U.S. Cl.
CPC ......... H04B 1/1036 (2013.01); H03H 7/0115 (2013.01); *H03H 2007/013* (2013.01); *H04B 2001/1063* (2013.01)

(58) Field of Classification Search
CPC .... H04B 1/1036; H04B 1/005; H04B 1/0057; H04B 1/0064; H04B 1/04; H04B 1/0483; H04B 1/40; H04B 2001/1063
See application file for complete search history.

(56) References Cited

U.S. PATENT DOCUMENTS

| | | | |
|---|---|---|---|
| 2014/0055210 A1* | 2/2014 | Black | H04B 1/525 333/132 |
| 2019/0306805 A1* | 10/2019 | Hasnain | H04W 88/10 |
| 2020/0186400 A1* | 6/2020 | Lee | H04B 1/0064 |

* cited by examiner

*Primary Examiner* — Tuan Pham
(74) *Attorney, Agent, or Firm* — PERKINS COIE LLP

(57) ABSTRACT

Introduced here are approaches to mitigating the desensitization and intermodulation effects that can affect telecommunication performance of multiband electronic devices. Specifically, the present disclosure outlines an approach to mitigating the coexistence effect at the system level using tunable filters that are implemented or controlled via software.

12 Claims, 9 Drawing Sheets

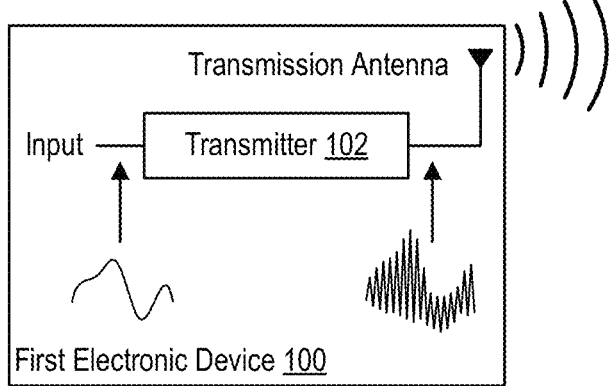
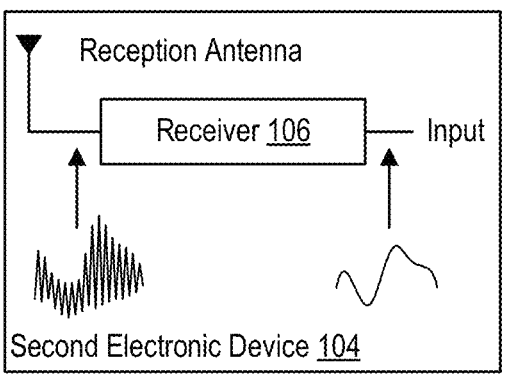
FIGURE 1A
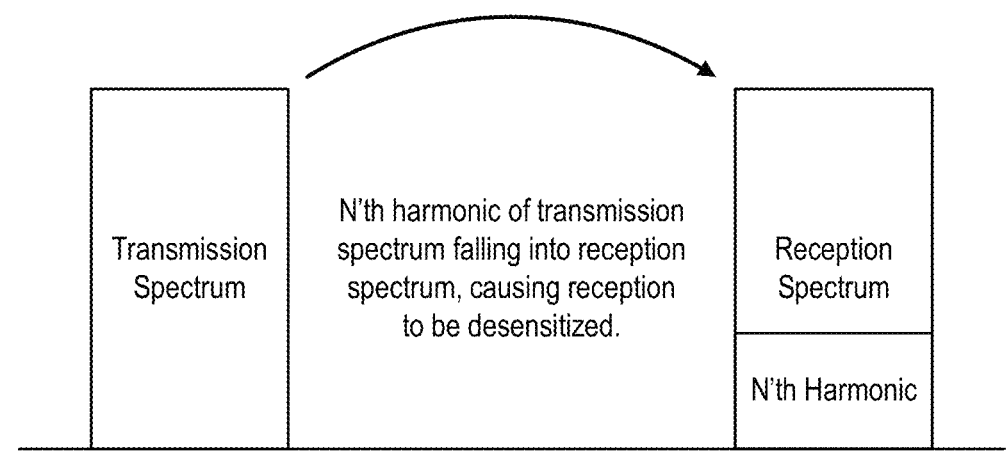
FIGURE 1B

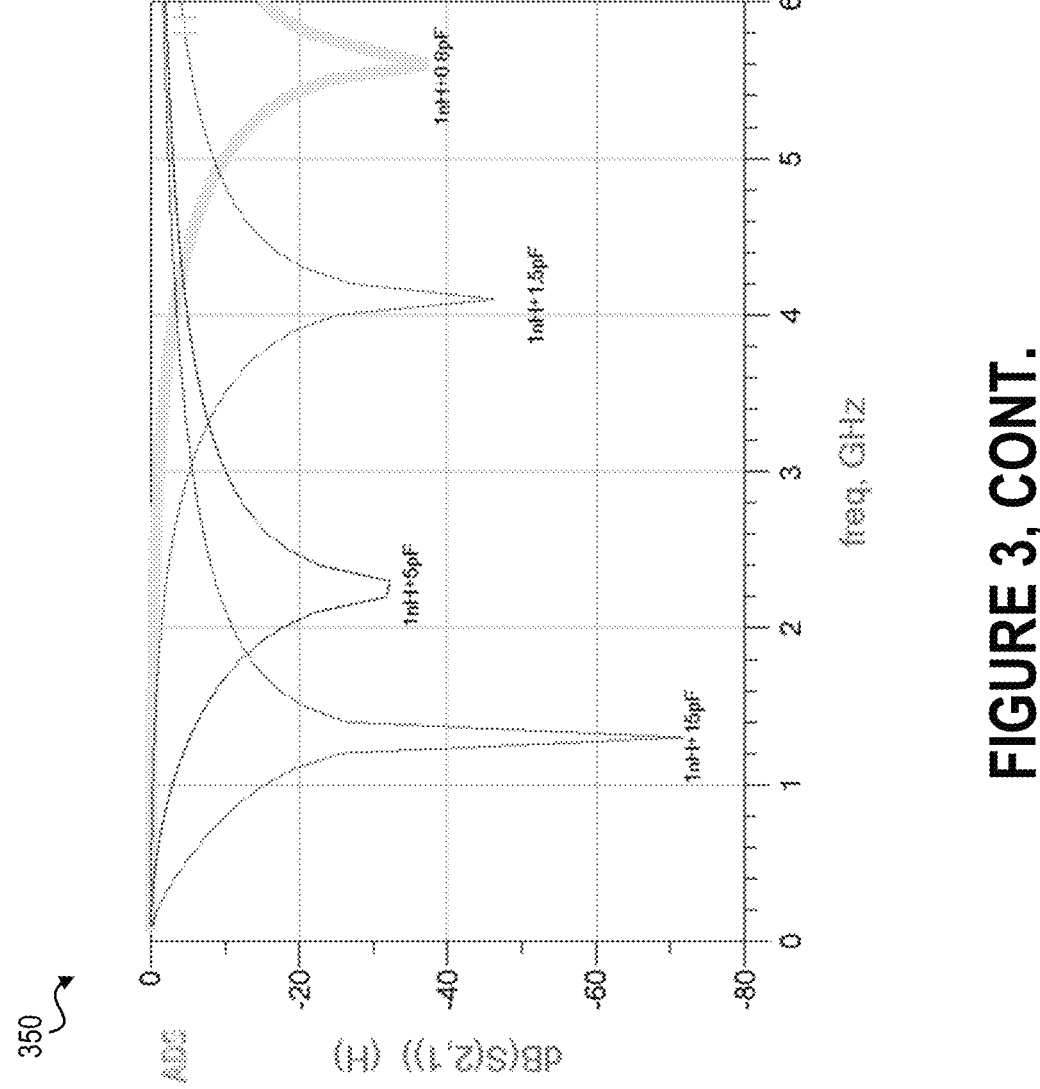
FIGURE 3, CONT.

FIGURE 4, CONT.

| Control 1 | | |
| --- | --- | --- |
| BW1 | Frequency1 | Inductance1 | Vcontrol1(mapped to capacitance1) |

| Control 2 | | |
| --- | --- | --- |
| BW2 | Frequency1 | Inductance2 | Vcontrol1(mapped to capacitance1) |

| Control 3 | | | |
| --- | --- | --- | --- |
| BW3 | Frequency1 | Inductance3 | Vcontrol1(mapped to capacitance1) |
| BW3 | Frequency2 | Inductnace3 | Vcontrol2(mapped to capacitance2) |
| BW3 | Frequency3 | Inductance3 | Vcontrol3(mapped to capacitance3) |
| BW3 | Frequency4 | Inductance3 | Vcontrol4(mapped to capacitance4) |

Figure 6:
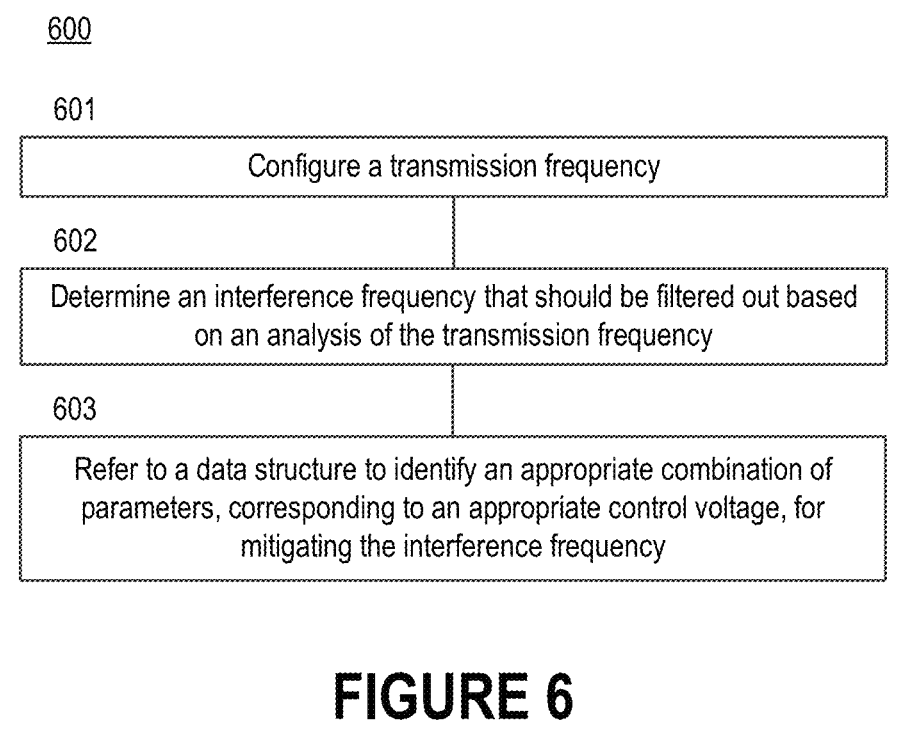

| Configure a transmission frequency |
| --- |

602

| Determine an interference frequency that should be filtered out based on an analysis of the transmission frequency |
| --- |

603

| Refer to a data structure to identify an appropriate combination of parameters, corresponding to an appropriate control voltage, for mitigating the interference frequency |
| --- |

PROMOTING COEXISTENCE OF MULTIPLE RADIO SYSTEMS THROUGH THE MITIGATION OF DESENSITIZATION AND INTERMODULATION EFFECTS

TECHNICAL FIELD

Various embodiments concern approaches to reducing intermodulation and harmonic interference in electronic communication devices that include more than one radio.

BACKGROUND

Electronic communication devices (also called "wireless communication devices") have traditionally used radio waves to carry information across space. Radio waves are electromagnetic waves that have a frequency between roughly 30 hertz (Hz) and 300 gigahertz (GHz). Radio waves are generated by an electronic component called a "transmitter" that is connected to an antenna which radiates the radio waves. The radio waves are then received by another antenna that is connected to another electronic component called a "receiver." Some electronic communication devices are adapted for unidirectional radio communication, having either a transmitter or a receiver. However, electronic communication devices generally have a transmitter and a receiver, so as to allow for the transmission and reception of radio waves for communication purposes.

The transfer of information via radio waves is presented in a simplified form in FIG. 1A. Such a transfer can be realized using an amplitude-modulated signal. Assume, for example, that the information being transferred from a first electronic communication device 100 to a second electronic communication device 104 is representative of an electrical signal output by a microphone. This electrical signal can be provided to a transmitter 102 as input, and the transmitter 102 can modulate the electrical signal onto an antenna for transmission to a destination external to the first electronic communication device 100. Specifically, the transmitter 102 can apply varying voltage to the antenna, which causes an electromagnetic field to be generated around the first electronic communication device 100.

This electromagnetic field will spread through the ambient space, symbolically shown using lines that radiate outward from the first electronic communication device 100. When the electromagnetic field reaches its intended destination—namely, the second electronic communication device 104—a voltage will be induced in its antenna as shown in FIG. 1A. The voltage induced at the antenna of the second electronic communication device 104 will have a similar profile as the voltage applied to the antenna of the first electronic communication device 100, except that the amplitude will be smaller. The voltage induced at the antenna of the second electronic communication device 104 can then be transformed into an electrical signal by a receiver 106, so as to reproduce the information to be transferred.

BRIEF DESCRIPTION OF THE DRAWINGS

FIG. 1A illustrates how information can be transferred via radio waves in a simplified form.

FIG. 1B includes a simplified illustration showing how the transmission spectrum of a first radio frequency band can interfere with the reception spectrum of a second radio frequency band.

FIG. 6 includes a flow diagram of a process that illustrates how a modem (and more specifically, its controller) can determine the appropriate entry in a data structure and then apply a control voltage to mitigate an interference frequency

Figure 2:
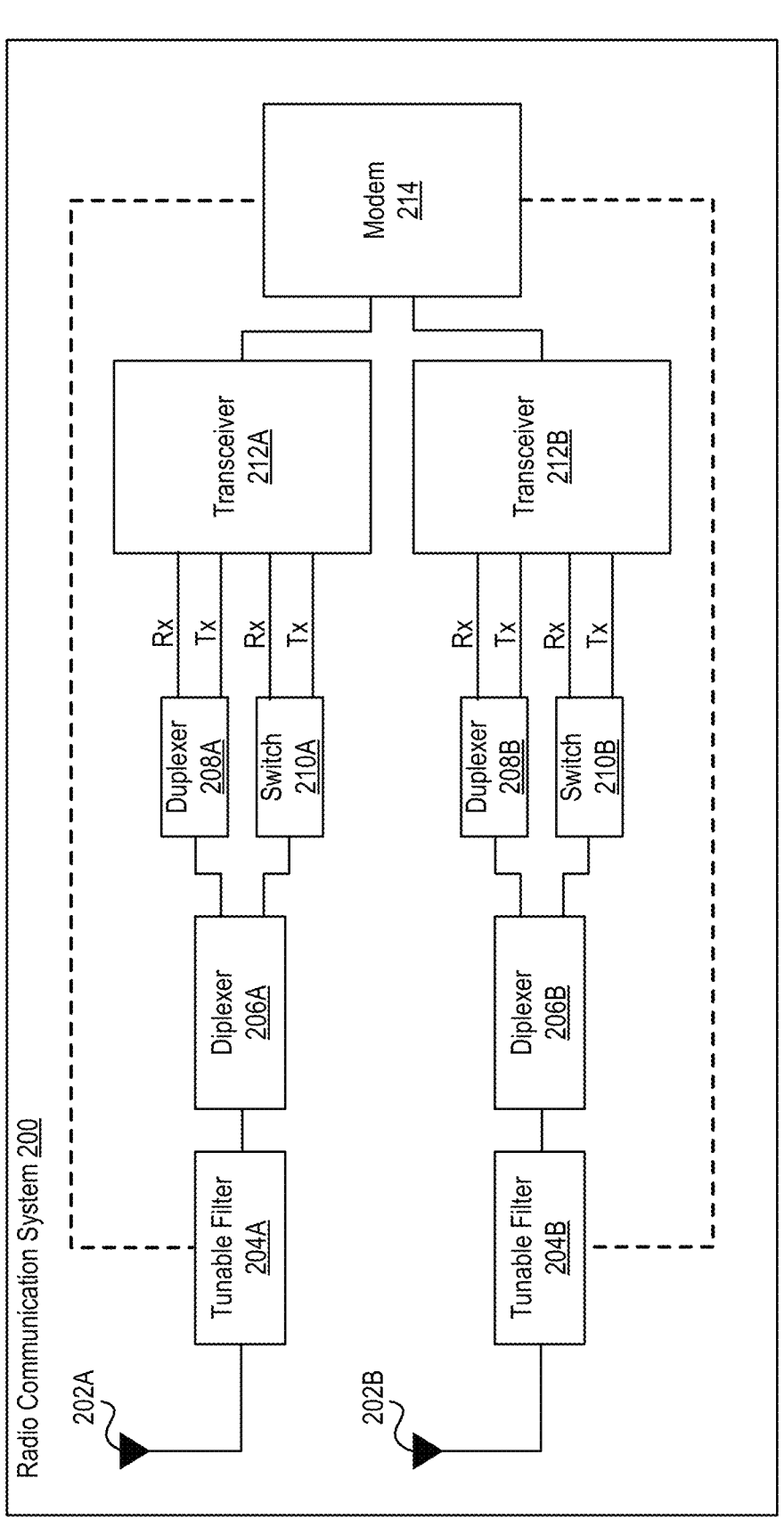
FIG. 2 illustrates an example of a radio communication system that is implementable in an electronic device that is designed to support multiple radio frequency bands.

Various features of the technology described herein will become more apparent to those skilled in the art from a study of the Detailed Description in conjunction with the drawings. Various embodiments are depicted in the drawings for the purpose of illustration. However, those skilled in the art will recognize that alternative embodiments may be employed without departing from the principles of the technology. Accordingly, although specific embodiments are shown in the drawings, the technology is amenable to various modifications.

DETAILED DESCRIPTION

Modern electronic communication devices (or simply "electronic devices") are commonly designed to support more than one radio frequency band in order to improve telecommunication performance. In telecommunications, the term "multiband electronic device" may be used to refer to electronic devices that support multiple radio frequency bands. Examples of such electronic devices include mobile phones, tablet computers, wearable computers (e.g., smartwatches, fitness trackers, and the like), mobile hotspot devices (or simply "mobile hotspots"), and cellular gateways. Note that while a radio frequency band may be associated with a single frequency, the radio frequency band is representative of a contiguous series of frequencies containing different channels.

Multiband electronic devices offer several notable benefits over single-band electronic devices. As an example, having multiple bands allows electronic devices to support multiple wireless telecommunication standards, such as the third-generation (3G) technology standard, the fourth-generation (4G) technology standard, or fifth-generation (5G) technology standard. As the number of wireless telecommunication standards grows, the need for multiple radio systems (or simply "radios") to operate in the same electronic device increases. This is especially true for electronic devices—such as mobile phones, tablet computers, and wearable computers in the form of smartwatches, fitness trackers, and the like—that support a number of cellular wireless technologies and/or non-cellular wireless technologies at the same time.

As a result, there are an increasing number of radio frequency bands that must mutually coexist in a single electronic device. However, these collocated radio frequency bands often interfere with one another, resulting in meaningful decreases in performance. FIG. 1B includes a simplified illustration showing how the transmission spectrum of a first radio frequency band can interfere with the reception spectrum of a second radio frequency band. When a signal is transmitted via the first radio frequency band, harmonics (e.g., first harmonic, second harmonic, . . . n'th harmonic) may be created. These harmonics can interfere with the reception capabilities of the second radio frequency band. Here, for example, the n'th harmonic of the transmission spectrum falls onto the reception spectrum, causing reception to be desensitized. These radio frequency bands can also make complying with conformance requirements (also called "certification requirements") increasingly challenging at the system level.

Introduced here are approaches to mitigating the desensitization and intermodulation effects that can affect telecommunication performance of multiband electronic devices. At a high level, filters can be employed in the "frontend" circuitry of an electronic device to mitigate the interference that can be caused by simultaneous collocation of different radios. As electronic devices are designed to support more radio frequency bands, the number of filters that are needed may also increase. This increasing demand for the number of filters may result in not only higher complexity of the "frontend" circuitry but also higher cost. To address these concerns, the present disclosure outlines an approach to mitigating the coexistence effect at the system level using filters that are implemented or controlled via software. One example of such a filter is a software-tunable notch filter. Notch filters (also called "band-stop filters" or "reject filters") are able to block frequencies within a defined range while allowing frequencies outside of the defined range.

Terminology

References in the present disclosure to "an embodiment" or "some embodiments" mean that the feature, function, structure, or characteristic being described is included in at least one embodiment. Occurrences of such phrases do not necessarily refer to the same embodiment, nor are they necessarily referring to alternative embodiments that are mutually exclusive of one another.

The term "based on" is to be construed in an inclusive sense rather than an exclusive sense. That is, in the sense of "including but not limited to." Thus, unless otherwise noted, the term "based on" is intended to mean "based at least in part on."

The terms "connected," "coupled," and variants thereof are intended to include any connection or coupling between two or more elements, either direct or indirect. The connection or coupling can be physical, logical, or a combination thereof. For example, elements may be electrically or communicatively coupled to one another despite not sharing a physical connection.

When used in reference to a list of multiple items, the word "or" is intended to cover all of the following interpretations: any of the items in the list, all of the items in the list, and any combination of items in the list.

Overview of Communication System for Multiband Electronic Devices

FIG. 2 illustrates an example of a radio communication system 200 (or simply "communication system") that is implementable in an electronic device that is designed to support multiple radio frequency bands. In order to mitigate the coexistence effect of those radio frequency bands, a separate software-tunable filter may be added for each radio frequency band.

For the purpose of illustration, assume that the communication system 200 is designed to enable telecommunication in accordance with a first wireless standard and a second wireless standard. For example, the first wireless standard could be the 3G technology standard for broadband cellular networks, and the second wireless standard could be the 4G technology standard for broadband cellular networks. As another example, the first wireless standard could be the 3G technology standard or the 4G technology standard for broadband cellular networks, and the second wireless standard could be the 5G technology standard for broadband cellular networks.

In such a scenario, a first tunable filter 204A can be implemented such that it filters radio signals propagating between a first antenna 202A and a first transceiver 212A associated with the first wireless standard. Similarly, a second tunable filter 204B can be implemented such that it filters radio signals propagating between a second antenna 202B and a second transceiver 212B associated with the second wireless standard. The first and second tunable filters 204A-B may be directly connected to the first and second antennas 202A-B, respectively, such that outgoing radio signals are filtered immediately prior to transmission and incoming radio signals are filtered immediately upon reception. As further discussed below, the first and second tunable filters 204A-B may be notch filters that can be used to remove or attenuate specific frequencies (or specific ranges of frequencies) that interfere with one another.

As shown in FIG. 2, each tunable filter 204A-B may be interconnected between a corresponding antenna 202A-B and corresponding diplexer 206A-B. A diplexer is a passive device that is able to multiplex a pair of ports (e.g., L and H) onto a third port (e.g., S) and vice versa. Accordingly, the communication system 200 may include (i) a first diplexer 206A that is configured to split filtered radio signals received from the first tunable filter 204A into a first pair of radio signals and (ii) a second diplexer 206B that is configured to split filtered radio signals received from the second tunable filter 204B into a second pair of radio signals. Each diplexer may include a low-pass filter and a high-pass filter to implement frequency-domain multiplexing. Generally, two ports (e.g., L and H) are multiplexed onto a third port (e.g., S). The signals on ports L and H occupy disjoint frequency bands. Consequently, the signals on L and H can coexist on port S without interfering with each other.

The first diplexer 206A may be connected to (i) a first duplexer 208A to which one radio signal of the first pair of radio signals is forwarded and (ii) a first switch 210A to which another radio signal of the first pair of radio signals is forwarded. Similarly, the second diplexer 206B may be connected to (i) a second duplexer 208B to which one radio signal of the second pair of radio signals is forwarded and (ii) a second switch 210B to which another radio signal of the second pair of radio signals is forwarded. The first duplexer 208A may be interconnected between the first diplexer 206A and the first transceiver 212A, and the first switch 210A may be interconnected between the first diplexer 206A and the first transceiver 212A. Meanwhile, the second duplexer 208B may be interconnected between the second diplexer 206B and the second transceiver 212B, and the second switch 210B may be interconnected between the second diplexer 206B and the second transceiver 212B.

Each transceiver may be able to communicate with the corresponding duplexer and switch in a bidirectional manner. Said another way, each transceiver may be able to receive radio signals from the corresponding duplexer and switch and transmit radio signals to the corresponding duplexer and switch. The first and second duplexers 208A-B may be passive devices similar to the first and second diplexers 206A-B. A duplexer is a passive device that is able to allow bidirectional communication (also called "duplex communication") over a single path by isolating electronic components operating at different frequencies. Each duplexer may include a pair of bandpass filters to implement bidirectional communication over a single path. Accordingly, each duplexer can be thought of as a three-port radio frequency component that is used in frequency division duplexed (FDD) systems to enable antenna sharing. In radio communications systems, it isolates the receiver from the transmitter while permitting those components to share a common antenna. In contrast to FDD systems, time division duplex (TDD) systems require fast on/off switching between a transmitter and a receiver, typically within one to five microseconds. One way to implement fast on/off switching is to use a radio frequency switch along the signal path.

As shown in FIG. 2, the first and second transceivers 212A-B may be connected to a modem 214, toward which the filtered radio signals are forwarded by the first and second tunable filters 204A-B. The modem 214 can be configured to convert data from a non-digital format (e.g., a filtered radio signal) into a digital format that is suitable for processing by the electronic device in which the communication system 200 is implemented. Similarly, the modem 214 can be configured to convert data from a digital format into a non-digital format (e.g., a radio signal) that is suitable for transmission via the first and second antennas 202A-B.

As mentioned above, the first and second filters 204A-B may be tunable. That is, the frequency (or range of frequencies) to be filtered by each tunable filter may be modified digitally. Based on the frequency of interest that needs to be filtered by each filter, the capacitance of the corresponding varactor diode can be varied, so as to achieve the application of a control voltage. Typically, this can be provided under microprocessor control via a digital-to-analog converter (also called a "DAC"). The modem 214 may be able to tune the first and second filters 204A-B by provisioning control signals via separate control lines. For example, the model 214 may use control voltages to tune the first and second filters 204A-B as further discussed below. Each tunable filter is normally associated with a different radio frequency band. It may be desirable to independently tune each tunable filter, so the modem 214 may have access to multiple control lines, each of which is associated with a different tunable filter. Accordingly, the modem 214 may be connected to the first tunable filter 204A via a first control line, along which the modem 214 can transmit a control signal to tune the first tunable filter 204A, and the modem 214 may be connected to the second tunable filter 204B via a second control line, along which the modem 214 can transmit another control signal to tune the second tunable filter 204B. Note that the components of the radio communication system 200 can be interconnected via conductive radio frequency traces (or simply "conductive traces") that are rated for 50 ohms, for example. Variable voltage for the varactor diodes can be controlled through the modem 214. Meanwhile, the first and second control lines can be used to switch on/off the PIN diodes of the first and second tunable filters 204A-B, respectively. As shown in FIG. 2, the first and second control lines may also be controlled through the modem 214.

Accordingly, the radio communication system 200 may include (i) a plurality of antennas at which to receive and transmit radio signals of different frequencies and (ii) a plurality of tunable filters configured to filter the radio signals. Generally, each tunable filter of the plurality of tunable filters is associated with a corresponding antenna of the plurality of antennas. However, a single tunable filter could be shared among two or more antennas, so long as its frequency range is tuned with sufficient frequency. Moreover, each tunable filter of the plurality of tunable filters may be separately connected to a source from which to receive instructions that indicate an upper bound and/or a lower bound used to filter the radio signals. As an example, in embodiments where the tunable filters are notch filters, each tunable filter may have manipulable upper and lower bounds. The source, meanwhile, could be the modem 214 or a separate controller that is connected to the modem 214, transceivers 212A-B, or other components of the electronic device in which the radio communication system 200 is implemented.

For the purpose of illustration, the communication system 200 is described as having two tunable filters to accommodate two wireless standards. However, those skilled in the art will recognize that the communication system 200 could include any number of tunable filters. In addition to dual-band electronic devices, the communication system 200 could be developed for, and implemented in, tri-band electronic devices, quad-band electronic devices, and penta-band electronic devices.

Overview of Tunable Filters

Coexisting transceivers that are operating in close proximity to one another in the same electronic device typically show some level of receiver desensitization. One of the main causes is electromagnetic interference generated by the transceivers as discussed above with reference to FIG. 1B. For each transceiver, this self-generated interference is often caused by the other nearby transceivers. As a result, sensitivity performance of its receiver may degrade (e.g., due to the n'th harmonic of the transmission spectrum of a nearby transmitted). For example, the noise floor of the receiver may increase, or the signal-to-noise ratio of the receiver may decrease.

One approach to addressing the electromagnetic interference involves employing band-specific filters in the "frontend" circuitry used for telecommunication purposes. Generally, multiple band-specific filters are used to reduce to reduce the coexistence effect of these "aggressor signals." These "aggressor signals" are usually comprised of a mixture of certain harmonics ($n^{th}$) of transmit radio signals—also called "intermodulation products"- and certain harmonics ($n^{th}$) themselves.

Traditionally, either a band-specific bandpass filter or a low-pass filter has been used in the "frontend" circuitry to mitigate the coexistence effect by rejecting or attenuating the unwanted radio signals—for example, the $n^{th}$ harmonic and $n^{th}$-order intermodulation products—that directly impact sensitivity of the receiver. However, this approach will increase the total noise figure of the receive chain, as well as increase the total insertion loss of the transmit chain. Moreover, if the rejection of the bandpass filter or the low-pass filter turns out to be poor in a later design stage, then there is no option but to recreate or "respin" the entire "frontend" circuitry with a more appropriate filter. Simply put, traditional approaches to mitigating the coexistence effect are not only impractical due to the rapid development of radio communication systems, electronic devices, and wireless standards but can also be prohibitively expensive.

With the tunable filters disclosed herein, the frequency and bandwidth can be tuned at any time based on the specific needs of the radio communication system or electronic device. Accordingly, a manufacturer need not "respin" the "frontend" circuitry due to poor design. Instead, the filters can be tuned to account for the requirements of a given radio communication system, electronic device, or wireless standard. Moreover, the total insertion loss and total noise figure may not be impacted due to the topology of the tunable filters (e.g., in embodiments where the tunable filters are notch filters, series inductor and capacitor parallel to the main path).

In sum, implementing tunable filters can result in a number of benefits in comparison to conventional approaches to mitigating the coexistence effect. These benefits include:

Bandwidth that is tunable by the order of the pole used in the filter;

Attenuation range that is tunable by the order of the pole used in the filter;

Lower number of band-specific filters included in the "frontend" circuitry;

Mitigation of receiver desensitization due to intermodulation products and harmonics;

Minimization of layout changes of the printed circuit board used in the "frontend" circuitry, as well as minimization of "respinning" of the printed circuit board; and Possibility of sharing a single tunable filter for multiple radio frequency bands in Frequency Division Duplex (FDD) systems and Time Division Duplex (TDD) systems.

A core aspect of the radio communication system described herein is its inclusion of a tunable filter. More specifically, the radio communication system include at least one tunable filter that includes a variable reactance network that is connected to a closed loop control system adapted to sense the control voltage across the variable reactance network and then adjust the reactance of the variable reactance network to tune the frequency of interest. As further discussed below, the variable reactance network may include a parallel capacitance or a series capacitance along with a parallel inductance or a series inductance. Several examples of tunable filters—specifically, tunable notch filters—are provided below.

Figure 3:
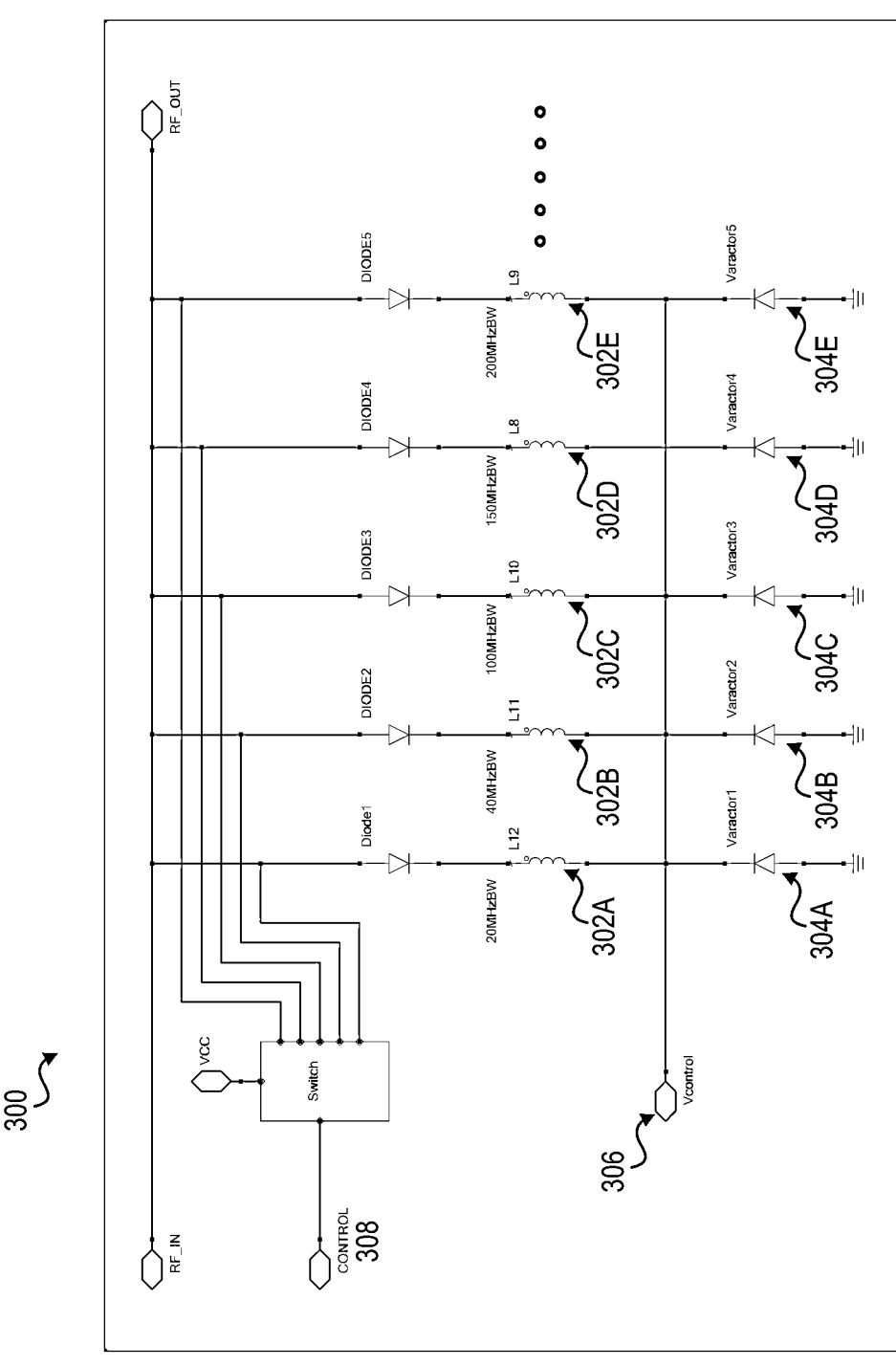
FIG. 3 includes an example of a lumped element filter that can be employed as a tunable notch filter.

FIG. 3 includes an example of a lumped element filter 300 that can be employed as a tunable notch filter. The lumped element filter 300 may include an inductor 302A-E and a capacitor 304A-E that are combined in series with a PIN diode. Specifically, the capacitor 304A-E may take the form of a varactor diode. The terms "varactor diode," "variable capacitance diode," and "varactor" are commonly used to refer to voltage-controlled capacitors. As shown in FIG. 3, a variable voltage 306 (also called a "control voltage") may be applied across the varactor diode. Meanwhile, capacitance of the varactor diode may be tunable in the range of femtofarads (fF) to picofarads (pF). Generally, the lower the capacitance, the higher the notch frequency. A data structure (e.g., a lookup table) that characterizes the lumped element filter—for example, by programmatically associating values for control voltage 306 with values for capacitance—may be maintained in a storage medium. The storage medium may be included in the electronic device of which the lumped element filter is a part, or the storage medium may be accessible (e.g., via a network) to the electronic device of which the lumped element filter is a part.

In operation, the inductor 302A-E and varactor diode may act as a variable reactance network (also called a "variable reactance element"). Note that the variable reactance element may include a parallel capacitance element or a series capacitance element along with a parallel inductance element or a series inductance element. Regardless of its form, the variable reactance element can be connected to a closed loop control system 308 (also called a "controller") that is adapted to sense the control voltage 306 applied across the capacitance element. The controller 308 may be a modem (e.g., modem 214 of FIG. 2), for example. Generally, the control voltage 306 is applied across a conductive wire that extends between the inductance element and the capacitance element. Based on the sensed control voltage, the controller 308 can adjust the reactance of the variable reactance element—and more specifically, the capacitance of the capacitance element—to tune to a frequency range of interest.

As shown in FIG. 3, the inductors 302A-E included in the lumped element filter 300 can have different inductance values. These inductance values can be selected based on the bandwidth of interest (e.g., 20 MHz BW, 40 MHz BW, 100 MHz BW, 150 MHz BW, 200 MHz BW, etc.). Generally, the higher the inductance, the narrower the bandwidth and the lower the notch frequency. Similarly, the number of variable reactance elements (and therefore, inductors and varactor diodes) can vary depending on the bandwidth of interest, as well as the amount of specificity that is desired. At a high level, if a larger bandwidth or a greater number of filtering options is desired, then more variable reactance elements should be implemented. A lumped element filter could include any number of variable reactance elements. For example, a lumped element filter could include three, five, or seven variable reactance elements, though the greater the number of variable reactance elements, the greater the responsibility of the controller.

FIG. 3 also includes a plot 350 showing how different combinations of capacitance values and inductance values can influence the magnitude, frequency, and bandwidth of the tunable notch filter. Information regarding these combinations can be stored in the data structure mentioned above, such that the controller can readily implement a notch filter—based on lumped element filter 300 of FIG. 3—having any of those characteristics upon being instructed to do so.

Figure 4:
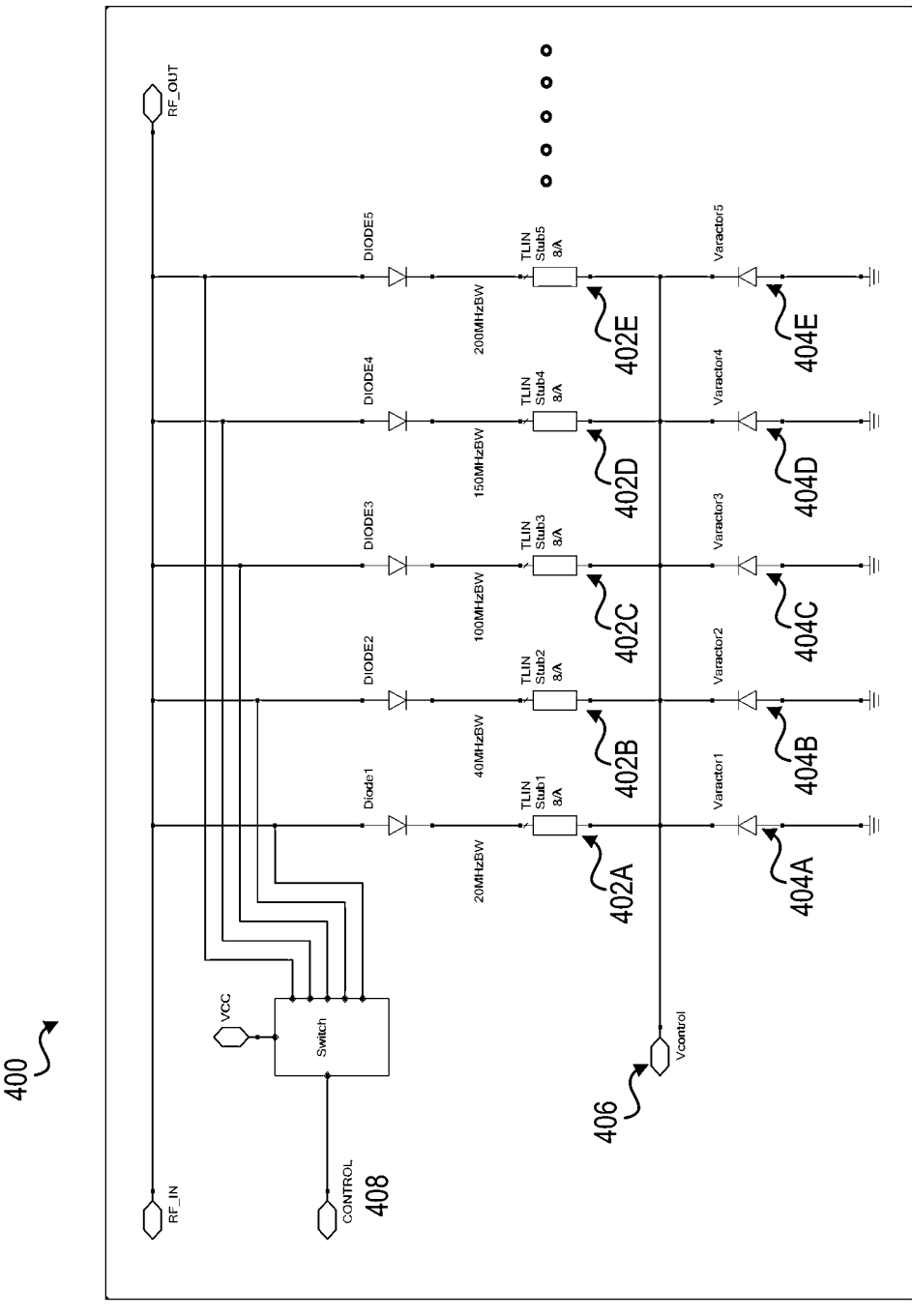
FIG. 4 includes another example of a lumped element filter that can be employed as a tunable notch filter.

FIG. 4 includes another example of a lumped element filter 400 plus a short-circuit stub 402A-E (or simply "stub") that together can be employed as a tunable notch filter. In this example, the stub 402A-E can be used as an inductor, and the length of the stub 402A-E can be selected based on the bandwidth of interest. As mentioned above, the higher the inductance, the narrower the bandwidth and the lower the notch frequency in most cases, As shown in FIG. 4, a varactor diode 404A-E and a resistor can be connected in series by a conductive wire, and a variable voltage 406 (also called a "control voltage") may be applied across the varactor diode. Some embodiments may not include the resistor. More specifically, the control voltage 406 may be applied to the conductive wire connected to the cathode side of the varactor diode 404A-E. Thus, the varactor diode 404A-E may be controlled by varying the control voltage 406, such that the capacitance of the varactor diode 404A-E may be tunable in the range of fF to pF. Again, the lower the capacitance, the higher the notch frequency in most cases. With the exception of the substitution of the stub 402A-E for the inductor, the lumped element filter 400 of FIG. 4 may otherwise operate similar to the lumped element filter 300 of FIG. 3.

FIG. 4 also includes a plot 450 showing how different combinations of capacitance values and inductance values can influence the magnitude, frequency, and bandwidth of the tunable notch filter. Information regarding these combinations can be stored in a data structure that is accessible to the controller 408, such that the controller 408 can readily implement a notch filter—based on lumped element filter 400 of FIG. 4—having any of those characteristics upon being instructed to do so.

Note that, in some embodiments, the lumped element filter may include a series of sub-elements—each of which may be representative of a separate tunable notch filter—that are independently controllable via separate control lines. Each sub-element can be connected to the controller by a separate control line that is connected to the conductive wire interconnected between the PIN diode and the resistor. Again, the resistor may be included in some embodiments. In such embodiments, the spacing between the sub-elements may be roughly consistent. For example, the spacing may be lambda over four (i.e., $\lambda/4$) or lambda over two (i.e., $\lambda/2$). While the exact value of the spacing can vary, the value normally relates to the resistance of the resistors included in the sub-elements. Note that the resistance of those resistors need not be comparable. For example, the resistance of the resistor included in a first sub-element is lambda over four (i.e., $\lambda/4$), the resistance of the resistor included in a second sub-element is lambda over two (i.e., $\lambda/2$), and the resistance of the resistor included in a third sub-element is three times lambda over four (i.e., $3\lambda/4$). Those skilled in the art will recognize that these values are provided for the purpose of illustration. The resistors could have higher or lower resistances, and the resistances across the sub-elements could be different ratios.

Figure 5:
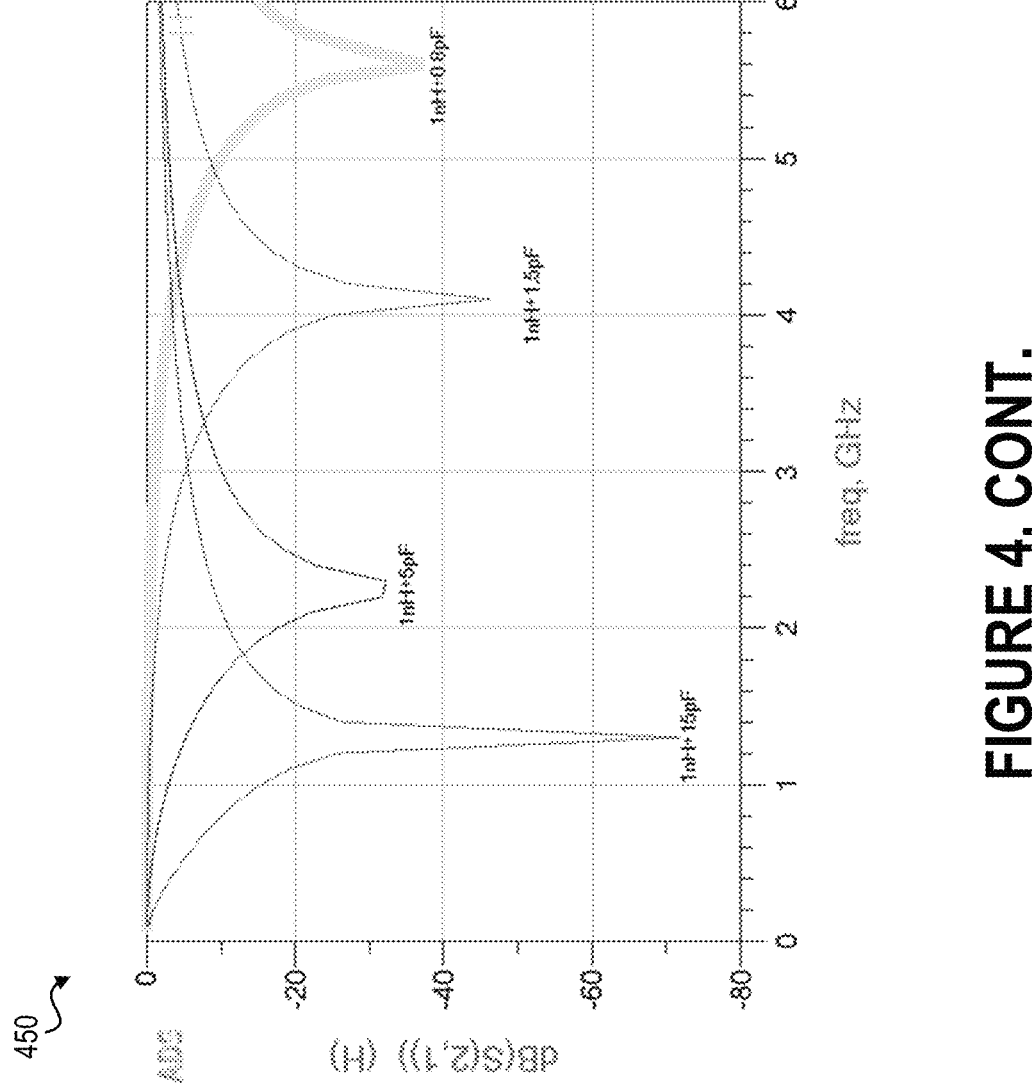
FIG. 5 illustrates how data structures—here, in the form of lookup tables—can include characterized values that are stored in memory accessible to the controller.

FIG. 5 illustrates how data structures—here, in the form of lookup tables—can include characterized values that are stored in memory accessible to the controller. For example, the memory may be part of the controller itself, or the memory may be part of the electronic device of which the controller is a part. Generally, each data structure is associated with a lumped element filter or a sub-element of a lumped element filter. As shown in FIG. 5, each data structure may include parameter values for bandwidth, frequency, inductance, and control voltage (which may be mapped to capacitance). Based on the frequency of interest and the bandwidth of the undesired signal to be filtered out, the controller can select the correct combination of inductance and capacitance from the appropriate data structure.

A serial interface, such as a Mobile Industry Processor Interface (MIPI), Serial Peripheral Interface (SPI), System Power Management Interface (SPMI), or Inter-Integrated Circuit (I²C), could be used by the controller to manage the switch that is interconnected between the controller and each lumped element filter. For example, the value "000" may correspond to a control voltage (e.g., $V_{cc} > 0.7 \ V + V_{control}$) being applied to a first path, the value "001" may correspond to a control voltage being applied to a second path, the value "010" may correspond to a control voltage being applied to a third path, the value "011" may correspond to a control voltage being applied to a fourth path, and so on. The control voltage may be supplied by the processor.

FIG. 6 includes a flow diagram of a process 600 that illustrates how a modem (and more specifically, its controller) can determine the appropriate entry in a data structure and then apply a control voltage to mitigate an interference frequency.

Initially, the modem can configure the transmission spectrum of a first radio frequency band (also called the "transmission frequency") and corresponding bandwidth to be used. Said another way, the modem can configure the transmission frequency and bandwidth (step 601).

As discussed above, harmonics of the transmission frequency can interference with the reception capabilities of a second radio frequency band (also called the "reception frequency"). Accordingly, the modem can determine the interference frequency that should be filtered out based on an analysis of the transmission frequency (step 602). For example, the modem may establish that a given harmonic (e.g., the second harmonic or third harmonic) should be filtered out as there is a high likelihood of interfering with the reception frequency.

Then, the modem can refer to a data structure stored in its memory to identify an appropriate combination of parameters based on the interference frequency (step 603). For example, the modem may examine one or more lookup tables (e.g., the lookup tables of FIG. 5) to select the correct combination of parameters that will result in mitigation of the interference frequency.

Processing System

Figure 7:
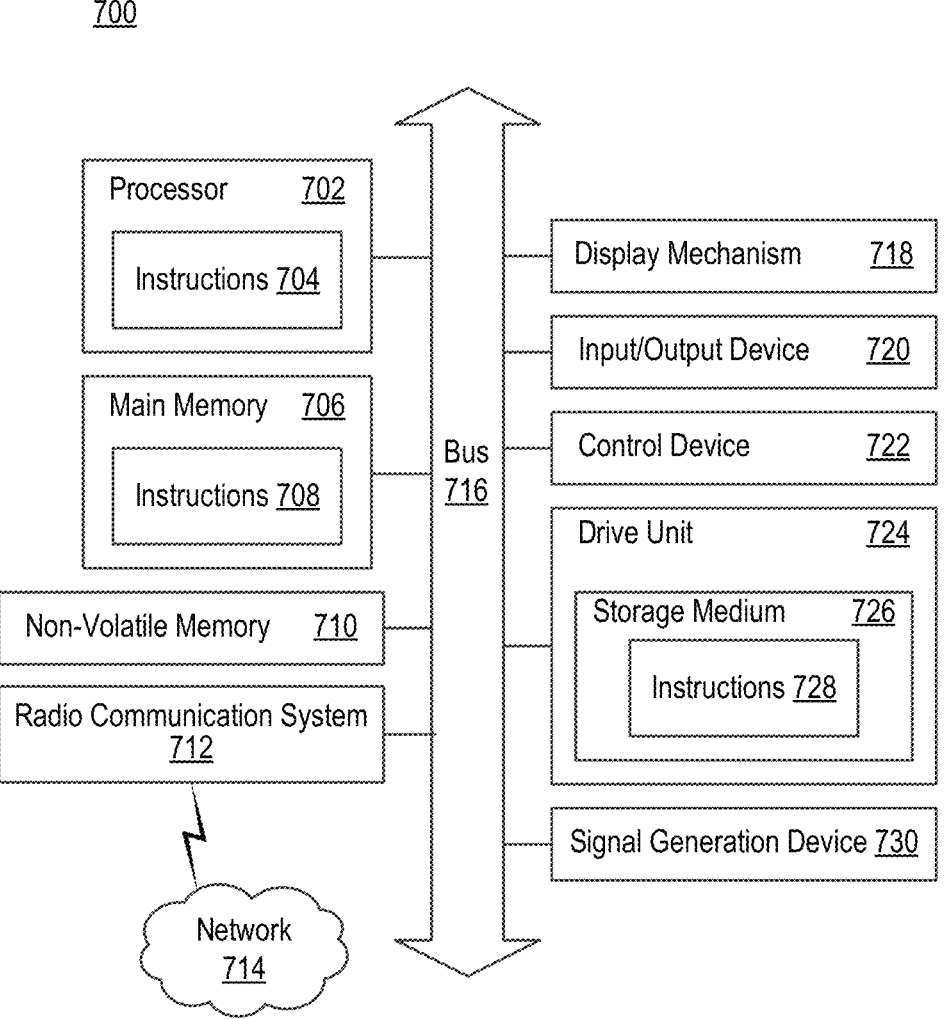
FIG. 7 is a block diagram illustrating an example of a processing system in which at least some operations described herein can be implemented.

FIG. 7 is a block diagram illustrating an example of a processing system 700 that can include a radio communication system 712 as described above. For example, components of the processing system 700 may be hosted on an electronic device such as a mobile phone, tablet computer, or wearable computer.

In addition to the radio communication system 712, the processing system 700 may include any combination of a processor 702, main memory 706, non-volatile memory 710, display mechanism 718, input/output device 720, control device 722, drive unit 724 including a storage medium 726, and signal generation device 730 that are communicatively connected to a bus 716. The bus 716 is illustrated as an abstraction that represents one or more physical buses or point-to-point connections that are connected by appropriate bridges, adapters, or controllers. The bus 716, therefore, can include a system bus, a Peripheral Component Interconnect (PCI) bus or PCI-Express bus, a HyperTransport or industry standard architecture (ISA) bus, a small computer system interface (SCSI) bus, a universal serial bus (USB), inter-integrated circuit (I²C) bus, or an IEEE Standard 1394 bus (also referred to as "Firewire").

While the main memory 706, non-volatile memory 710, and storage medium 726 are shown to be a single medium, the terms "machine-readable medium" and "storage medium" should be taken to include a single medium or multiple media (e.g., a centralized or distributed database and/or associated caches and servers) that store one or more sets of instructions 728. The terms "machine-readable medium" and "storage medium" shall also be taken to include any medium that is capable of storing, encoding, or carrying a set of instructions for execution by the processing system 700.

In general, the routines executed to implement the embodiments of the disclosure may be implemented as part of an operating system or a computer programs. Computer programs typically comprise instructions (e.g., instructions 704, 708, 728) set at various times in various memory and storage devices in an electronic device. When read and executed by the processor 702, the instructions cause the processing system 700 to implement aspects of the present disclosure. As an example, input received through the input/output device 720 may be converted into a digital signal that is appropriately modulated and then transmitted to a destination using the radio communication system 712 as discussed above.

Further examples of machine- and computer-readable media include recordable-type media, such as volatile memory devices and non-volatile memory devices 710, removable disks, hard disk drives, and optical disks (e.g., Compact Disk Read-Only Memory (CD-ROMS) and Digital Versatile Disks (DVDs)), and transmission-type media, such as digital and analog communication links.

The radio communication system 712 enables the processing system 700 to mediate data with an entity that is external to the electronic device in which the processing system 700 is implemented through any communication protocol supported by the processing system 700 and the external entity. For example, the radio communication system 712 may mediate data via a network 714 in accordance with a wireless protocol, such as the 3G technology standard, 4G technology standard, or 5G technology standard.

Remarks

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. An electronic device comprising:
   a first tunable notch filter that is configured to filter radio signals propagating between a first antenna and a first transceiver associated with a first wireless standard;
   a second tunable notch filter that is configured to filter radio signals propagating between a second antenna and a second transceiver associated with a second wireless standard;
   a first diplexer configured to split filtered radio signals received from the first tunable notch filter into a first pair of radio signals;
   a second diplexer configured to split filtered radio signals received from the second tunable notch filter into a second pair of radio signals, and
   a modem to which the filtered radio signals are forwarded by the first and second tunable notch filters.

2. The electronic device of claim 1, wherein the modem is configured to convert data from a digital format into a format suitable for transmission via the first and second antennas.

3. The electronic device of claim 1,
   wherein the modem is connected to the first tunable notch filter via a first control line, along which the modem is able to transmit a signal to tune the first tunable notch filter, and
   wherein the modem is connected to the second tunable notch filter via a second control line, along which the modem is able to transmit a signal to tune the second tunable notch filter.

4. The electronic device of claim 1,
   wherein the first diplexer is connected to—
      a first duplexer to which one radio signal of the first pair of radio signals is forwarded, and
      a first switch to which another radio signal of the first pair of radio signals is forwarded; and
   wherein the second diplexer is connected to—
      a second duplexer to which one radio signal of the second pair of radio signals is forwarded, and
      a second switch to which another radio signal of the second pair of radio signals is forwarded.

5. The electronic device of claim 4,
   wherein the first duplexer is interconnected between the first diplexer and the first transceiver,
   wherein the first switch is interconnected between the first diplexer and the first transceiver,
   wherein the second duplexer is interconnected between the second diplexer and the second transceiver, and
   wherein the second switch is interconnected between the second diplexer and the second transceiver.

6. The electronic device of claim 1, wherein the first wireless standard is the third-generation (3G) technology standard or the fourth-generation (4G) technology standard for broadband cellular networks, and wherein the second wireless standard is the fifth-generation (5G) technology standard for broadband cellular networks.

7. An electronic device comprising:
   a first tunable notch filter that is configured to filter radio signals propagating between a first antenna and a first transceiver associated with a first wireless standard;
   a second tunable notch filter that is configured to filter radio signals propagating between a second antenna and a second transceiver associated with a second wireless standard; and
   a modem to which the filtered radio signals are forwarded by the first and second tunable notch filters,
      wherein the modem is connected to the first tunable notch filter via a first control line, along which the modem is able to transmit a signal to tune the first tunable notch filter, and
      wherein the modem is connected to the second tunable notch filter via a second control line, along which the modem is able to transmit a signal to tune the second tunable notch filter.

8. The electronic device of claim 7, wherein the modem is configured to convert data from a digital format into a format suitable for transmission via the first and second antennas.

9. The electronic device of claim 7, further comprising:
   a first diplexer configured to split filtered radio signals received from the first tunable notch filter into a first pair of radio signals; and

a second diplexer configured to split filtered radio signals received from the second tunable notch filter into a second pair of radio signals.

10. The electronic device of claim 9, wherein the first diplexer is connected to—
 a first duplexer to which one radio signal of the first pair of radio signals is forwarded, and
 a first switch to which another radio signal of the first pair of radio signals is forwarded; and wherein the second diplexer is connected to—
 a second duplexer to which one radio signal of the second pair of radio signals is forwarded, and
 a second switch to which another radio signal of the second pair of radio signals is forwarded.

11. The electronic device of claim 10, wherein the first duplexer is interconnected between the first diplexer and the first transceiver, wherein the first switch is interconnected between the first diplexer and the first transceiver, wherein the second duplexer is interconnected between the second diplexer and the second transceiver, and wherein the second switch is interconnected between the second diplexer and the second transceiver.

12. The electronic device of claim 7, wherein the first wireless standard is the third-generation (3G) technology standard or the fourth-generation (4G) technology standard for broadband cellular networks, and wherein the second wireless standard is the fifth-generation (5G) technology standard for broadband cellular networks.

\* \* \* \* \*